United States Patent [19]
Burns et al.

[11] Patent Number: 5,382,848
[45] Date of Patent: Jan. 17, 1995

[54] DIGITAL INTEGRATED TIME OF ARRIVAL DETECTOR

[75] Inventors: Lawrence M. Burns, El Segundo; Robert Tso, South San Gabriel, both of Calif.

[73] Assignee: Hughes Aircraft Company, Los Angeles, Calif.

[21] Appl. No.: 943,632

[22] Filed: Sep. 11, 1992

[51] Int. Cl.[6] .................................................. H03K 5/153
[52] U.S. Cl. .......................................... 327/18; 327/72; 327/284
[58] Field of Search ................. 307/261, 268, 517, 603

[56] References Cited

U.S. PATENT DOCUMENTS

| | | | |
|---|---|---|---|
| 4,341,964 | 7/1982 | Chi et al. | 307/517 |
| 4,397,042 | 8/1983 | Tsujii et al. | 307/261 X |
| 4,698,528 | 10/1987 | Marple et al. | 307/517 |
| 4,775,804 | 10/1988 | Marple | 307/268 X |
| 5,118,967 | 6/1992 | Muth | 307/261 X |
| 5,317,215 | 5/1994 | Kranzler | 307/517 |

OTHER PUBLICATIONS

Tsui, "Microwave Receivers with Electronic Warfare Applications", John Wiley & Sons, 1-1986, pp. 89-94.
Taub and Schilling, "Principles of Communications Systems", McGraw-Hill, Inc., 1-1971, pp. 216-221.

Primary Examiner—Willis R. Wolfe
Attorney, Agent, or Firm—Georgann S. Grunebach; Terje Gudmestad; W. K. Denson-Low

[57] ABSTRACT

A time of arrival detector for an analog pulse signal digitizes the pulse, digitally delays the digitized signal in one path and converts the delayed signal back to a delayed analog version of the input signal. In a second path an undelayed analog version of the input signal is provided. A scaling offset is established to scale the delayed signal larger than the undelayed signal, and the delayed and undelayed signals are then compared to establish a time of arrival for the input pulse. A delta modulator is preferably used to provide the digitized signal, and also to provide the undelayed analog version of the input signal as the smoothed output of an integrator within the delta modulator. The undelayed modulator output is preferably attenuated by −3 dB, with the pulse's time of arrival obtained from the time at which the delayed analog signal rises above the undelayed but attenuated signal. The time of arrival of the pulse's trailing edge is obtained in a similar manner by scaling the undelayed signal larger than the delayed signal, and comparing the two resulting signals to detect when the undelayed signal falls below the delayed signal. The pulse width can then be determined by subtracting the pulse's time of arrival from its time of termination.

19 Claims, 3 Drawing Sheets

DIGITAL INTEGRATED TIME OF ARRIVAL DETECTOR

BACKGROUND OF THE INVENTION

1. Field of the Invention

This invention relates to time of arrival detector circuits, and more particularly to such circuits in which an arriving signal is delayed and the delayed signal is compared with the original signal to determine its time of arrival.

2. Description of the Related Art

Time of arrival detectors for electrical pulses are used in applications such as radar and commercial pulsed ranging systems. The detection of a pulse's arrival time is complicated by the fact that pulses often vary over a wide range of amplitudes, rise and fall times, and pulse widths.

A pulse's time of arrival is measured with respect to some fixed time on the pulse, which ideally should be independent of rise and fall times for the pulse amplitude. The problem is illustrated in FIGS. 1a and 1b. Assume, for example, that a transmitter produces a single pulse that is received by two receivers, each equidistant from the source, but one having a higher gain antenna than the other (the analogous case of a single receiver and two transmitters is also possible). The receiver with the higher gain antenna will thus observe a greater amplitude pulse than the other receiver. In FIG. 1a the curve 2 represents the leading edge of the higher amplitude pulse, while in FIG. 1b the curve 4 represents the leading edge of the lower amplitude pulse.

One approach to determining the pulse's time of arrival would be to use a simple level detector to determine when the pulse crosses a fixed threshold, with the crossing point taken as the time of arrival. In FIG. 1a the larger amplitude pulse is illustrated as rising to a normalized unity peak amplitude. Assuming that the threshold level for the time of arrival indication is 0.5 and that the first energy of the incoming pulse is detected at time T1, a pulse arrival indication will be produced at time T2 when the rising pulse waveform crosses the 0.5 threshold. If the same 0.5 threshold is used for the same pulse in the lower antenna gain amplifier of FIG. 1b, which is assumed to have a peak value of only 0.6, the lower gain pulse 4 will cross the threshold at a time T2' that is later than T2.

The difference between T2 and T2' represents an error in the time of arrival measurement, since the two receivers are assumed to be equidistant from the transmitter and accordingly the pulse arrives at both receivers at the same time. To avoid amplitude errors with a simple level detector, the risetime of the pulse must be extremely short. Even worse, if the arriving signal is too weak to cross the threshold, it will never be counted as having "arrived".

To eliminate these problems, a method has been devised in which a delayed, amplified version of the pulse is compared to an undelayed, unamplified version to produce a time of arrival indication. With this approach, the time of arrival is designated as the time at which the amplified version of the pulse reaches a value that is a fixed amount below its final value, such as 3dB, less the delay that was added to the amplified signal. The amplification factor is accordingly set so that the peak value of the undelayed, unamplified pulse is 3dB less than the peak value of the delayed amplified pulse. The unamplified pulse can thus be used as a threshold, with the time of arrival based upon the time when the delayed and amplified pulse rises above the undelayed, unamplified pulse. This technique is described, for example, in Tsui, *Microwave Receivers with Electronic Warfare Applications*, John Wiley & Sons, 1986, pages 89–94, and is illustrated in FIGS. 2a and 2b.

In FIG. 2a the original unamplified pulse 6 is again assumed to begin rising at time T1. The amplified version 8 of the pulse begins to rise after a fixed delay period, and continues rising to a level 3dB above the peak of the undelayed pulse 6. The time T2 at which the delayed pulse 8 rises above the undelayed pulse 6 is taken as the time of arrival for the original pulse (minus the delay).

FIG. 2b demonstrates that, with the described approach, two pulses that arrive at the same time and have equal rise times will result in simultaneous time of arrival indications even if their amplitudes differ. In FIG. 2b a similar pulse 6', which is an attenuated version of pulse 6, also begins to rise at time T1 and has the same rise time as pulse 6. A 3dB amplified and delayed pulse 8' that corresponds to delayed pulse 8 in FIG. 2a can be seen to cross and rise above the undelayed pulse 6' at the same time T2 as in FIG. 2a.

A block diagram of circuitry that is commonly used to implement the time of arrival scheme of FIGS. 2a and 2b is shown in FIG. 3. The input signal Vin is applied to an input terminal 10. The input line then branches, with one branch 12 connected directly to the negative input of an analog comparator CMP1. The other branch 14 is connected to a line driver amplifier A1 which drives the input signal through a delay line 16, typically a 40 nsec delay. An amplifier A2 at the output of the delay line overcomes the line loss and amplifies the delayed signal, generally by 3dB. The amplified delayed signal is applied to the positive input of comparator CMP1 for comparison with the unamplified, undelayed signal. The comparator produces a time of arrival indication at output terminal 18 when the signal at its positive input rises above the signal at its negative input.

The delay line 16 must be long enough to accommodate input signals with slow rise times, but not so long that its delay exceeds the width of narrow pulses. To measure pulses as narrow as 50 nsec or as wide as 200 microsec, a reasonable compromise for the delay period is on the order of 40 nsec. Additionally, the delay line must be wideband, since rise and fall times can be as small as 10 nsec Wideband coaxial cable is typically used, with approximately 28 linear feet of cable required to achieve the desired 40 nsec delay. This delay line has an impedance on the order of 50 ohms, and requires a relatively high power driver to transmit the signal (typically a few volts in amplitude). This delay line is large and bulky, and its delay tends to vary with frequency and temperature. The long length of the delay circuit makes it difficult, if not impossible, to miniaturize a circuit using this technique. Although ultraminiature coaxial cable is available with diameters as small as 0.2 mm, the resulting line loss can be as high as 38 dB at 500 MHz, which is generally intolerable. The line driver itself needs to be wideband and capable of driving a large signal down a relatively low impedance transmission line at high speed, which often results high driver power dissipation. In some cases the delay line is reduced in size by increasing its capacitance per unit length. However, since the inductance per unit length usually remains the same, this technique results in very low values of line impedance, further increasing the driver power requirement.

Currently available delay lines and their associated circuitry cannot be implemented as monolithic integrated circuits due to the size limitations described above. They are therefore usually fabricated as hybrid integrated circuits, or as part of a printed circuit board assembly. In either case the system's manufacturability and reliability suffer because of the many individual components that require interconnection.

SUMMARY OF THE INVENTION

The present invention seeks to provide an improved time of arrival detector for an analog input signal that is much more compact than prior systems, can be easily implemented in a single monolithically integrated chip, has lower power requirements and losses, and is relatively insensitive to variations in frequency and temperature.

These goals are realized with a system that converts the input analog signal to a digitized format that is directed along two paths. In one path the digitized signal is delayed by a desired amount, converted back to an analog format, and the reconverted analog signal delivered to one input of an output comparator. In the second path the digitized signal is converted back to analog format without any substantial delay, and this analog signal is delivered to the other input of the output comparator. A scaling offset is established between the two signals presented to the output comparator, so that the delayed signal as presented to the comparator is scaled larger than the undelayed signal. The comparator then compares the two signals to produce a time of arrival indication in response to the delayed signal rising above the undelayed signal.

In a preferred embodiment a delta modulator circuit is used to provide both the digitized signal that is thereafter delayed, and the undelayed analog signal. The delta modulator includes a latching comparator that digitizes the input analog signal, and a feedback integrating circuit that provides a reference for the latching comparator. The feedback integrating circuit reconverts the digitized signal back to analog format, and this signal is used as a reference in both the output comparator and the latching comparator.

The scaling offset between the delayed and undelayed signals that are compared by the output comparator is preferably established by attenuating the undelayed signal. To detect the time of arrival of the input pulse's trailing edge, the delayed signal can then be attenuated to a desired level below the undelayed signal, and these two signals applied to a second output comparator; the arrival of the pulse's trailing edge is indicated by the attenuated undelayed signal falling below the further attenuated delay signal. The detection of the times of arrival for both the leading and trailing edges of the pulse can then be used to determine the pulse width.

The invention totally eliminates the bulky and lossy analog delay line that was previously required. It is replaced with a simple digital delay, such as a shift register, that can be easily combined with the other components of the circuit in a single monolithic integration. Power consumption is significantly reduced, and the circuit is also less susceptible to temperature and frequency variations.

These and other features and advantages of the invention will be apparent to those skilled in the art from the following detailed description, taken together with the accompanying drawings.

DETAILED DESCRIPTION OF THE INVENTION

Figure 1A:
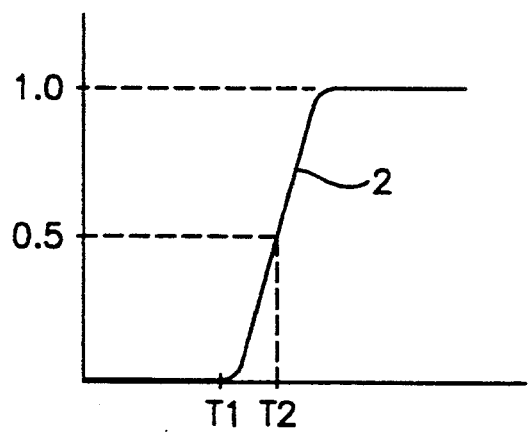
FIGS. 1a and 1b are graphs that illustrate a prior simple threshold technique, described above, for determining the time of arrival for a pulse signal.
Figure 1B:
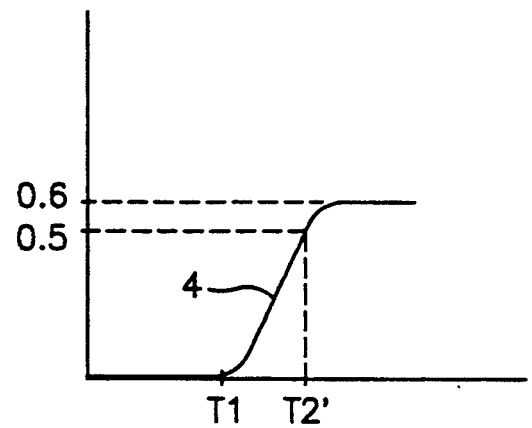
Figure 2A:
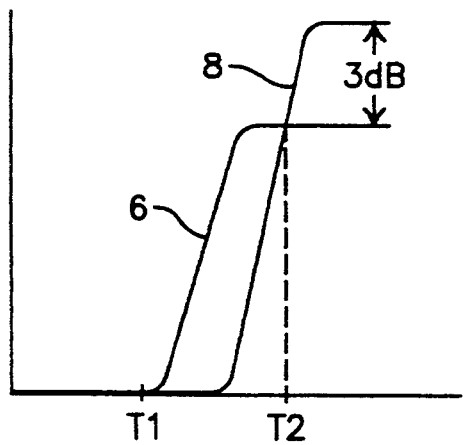
FIGS. 2a and 2b are graphs of a known technique, described above, for determining a pulse's time of arrival by comparing an undelayed version of the pulse with a delayed version; the same general approach is used in the present invention.
Figure 2B:
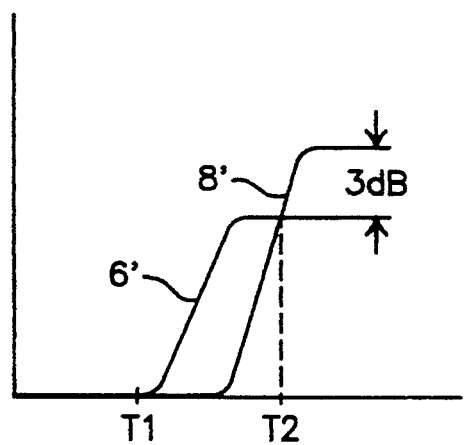
Figure 3:
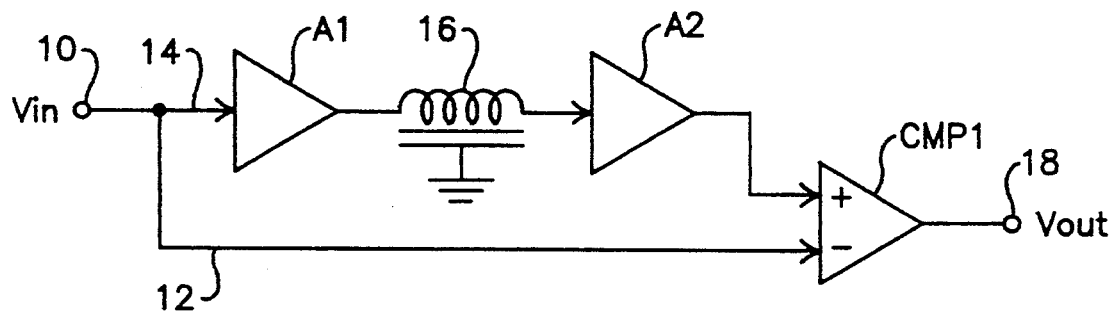
FIG. 3 is a block diagram described above, of a prior system used to implement the time of arrival detection scheme illustrated in FIGS. 2a and 2b.
Figure 4:
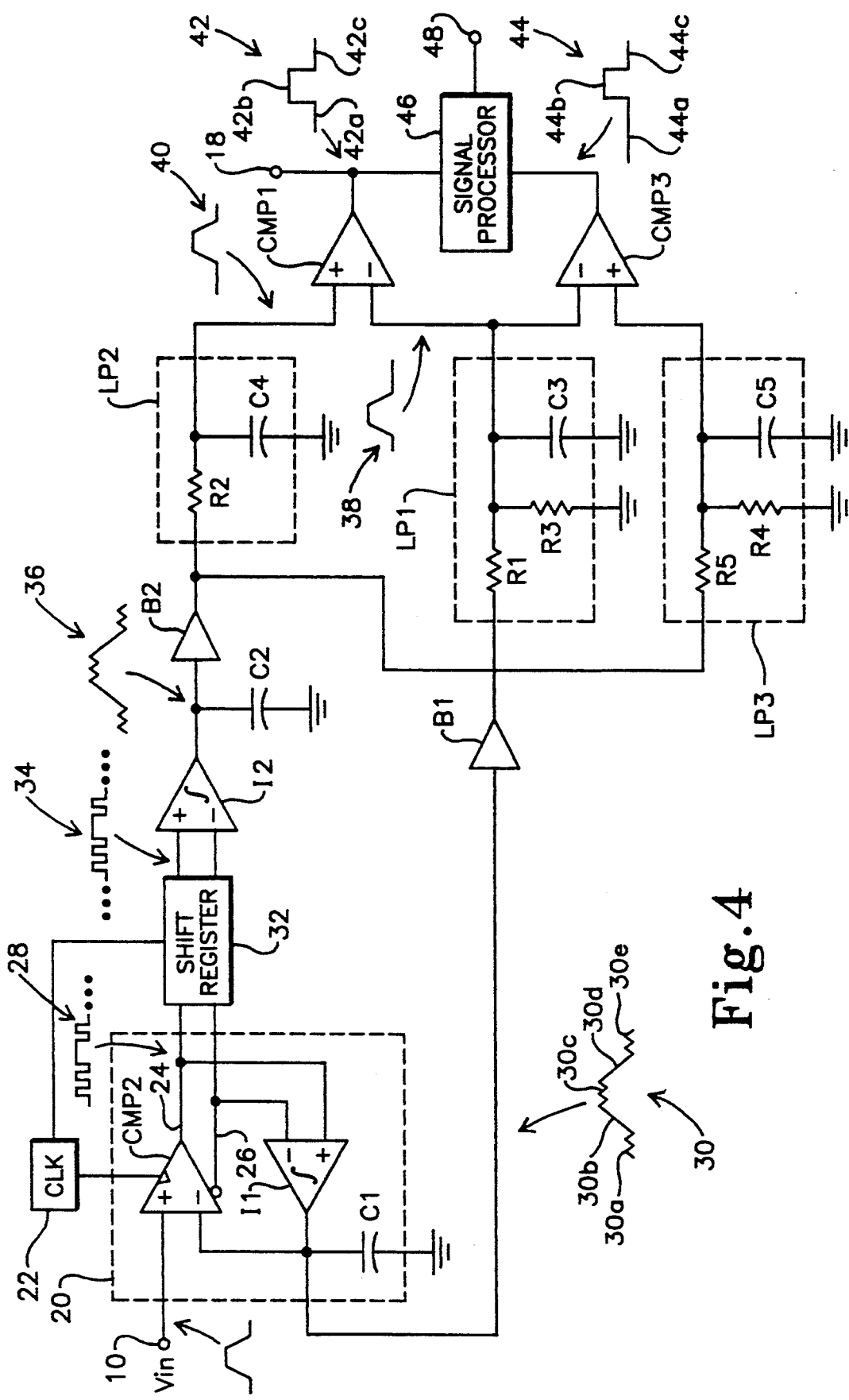
FIG. 4 is a circuit diagram of a time of arrival detection system in accordance with the invention.

FIG. 4 is a circuit diagram of a preferred form of a time of arrival detector provided by the invention. Voltage waveforms are included at various points throughout the circuit for ease of understanding. Elements that are the same as those in FIG. 3 are indicated by the same reference numerals.

A delta modulator circuit 20 receives the input pulse at input terminal 10, and produces both digitized and analog output versions of the input analog signal. Delta modulator circuits are well known, and are described for example in Taub and Schilling, *Principles of Communications Systems*, McGraw-Hill, Inc., 1971, pages 216-221. The circuit includes a latching comparator CMP2 that is controlled by a clock 22 to sample the input signal at a rate sufficiently high so as to discern the fastest expected rise time. The sample rate should be at least twice the Nyquist rate, and in a preferred embodiment is 1 GHz. The comparator CMP2 produces complementary outputs on lines 24 and 26, with the signal on line 24 HI when the signal at the comparator's positive input is greater than the signal at its negative input, and LO when the input pattern to the comparator is reversed; the signal on line 26 is complementary to that on line 24.

The signal on the comparator line 24 is a waveform 28 that consists of a pulse train of +1 (HI) or −1 (LO) pulses, depending upon the polarity of the differential between the CMP2 input signals during any given clock signal. This waveform and its complement are applied respectively to the positive and negative inputs of an integrating circuit I1, the output of which is fed back to the negative input for latching comparator CMP2.

Assuming that a positive-going input signal is applied at terminal 10 and the signal at the negative input to CMP2 is initially at ground level, a series of HI pulses will be produced on the comparator output line 24 that cause the integrator output to increase in a staircase fashion. The integrator output will continue to increase at each successive clocking until it exceeds the input signal, at which point a LO pulse is produced on line 24 to reduce the integrator output by one step. The integrator thus provides a reference that tends to correct for any differentials between the analog input and the digitized output of the comparator CMP2, and in this respect the circuit functions as a conventional delta modulator.

An output capacitor C1 smooths the integrator output to produce a signal such as that illustrated in waveform 30. The input to the integrator is oscillating between HI and LO during the initial period 30a before the pulse has arrived, remains at HI during the pulse rise time 30b, oscillates between HI and LO when the pulse levels out at an assumed peak value 30c, remains at LO during the pulse fall time 30d and thereafter resumes its alternation 30e between HI and LO.

The digitized delta modulator outputs on lines 24 and 26 are applied to a digital delay circuit, preferably implemented as a 40 stage shift register 32 that produces a 40 nsec digital delay for a 1 GHz clock rate. The shift register's total delay is precisely determined by the number of stages in the register and the clock rate, and is insensitive to temperature or the frequency of the input signal. Its output, illustrated by waveform 34, is a delayed replica of its digital input signal 28. The delayed digital signal is then converted back to an analog format by a second integrating circuit I2, the response time of which is matched with that of I1. A smoothing capacitor C2 at the output of integrator I2 smooths the integrated signal to yield a waveform 36 that matches waveform 30 at the output of integrator I1, but lags waveform 30 by the delay of shift register 32.

The undelayed and delayed analog signals at the outputs of integrators I1 and I2 are transmitted through respective buffer circuits B1 and B2 to respective low pass filters LP1 and LP2, which remove the high frequency oscillations from their respective input signals. The low pass filters LP1 and LP2 include respective matching resistors R1, R2 and capacitors C3, C4. In addition, the lowpass filter LP1 for the undelayed analog signal includes a second resistor R3 that is connected in parallel with capacitor C3; R3 functions together with R1 as a voltage divider to attenuate the applied analog signal. The values of R1 and R3 are selected so that the undelayed input to R1 is attenuated by a desired amount, preferably 3dB in conformance with the usual practice. Attenuating the undelayed signal is preferred to amplifying the delayed signal because the attenuator is simple to implement. However, if the input signals are small, an attenuator may produce a noise problem, in which case it would be preferable to amplify the delayed signal at the output of B1 by 3dB. In either case the buffers B1 and B2 prevent the smoothing capacitors C1 and C2 from discharging through their respective filters; the buffers can be implemented as npn emitter follower amplifiers.

The outputs of filters LP1 and LP2 are illustrated respectively by waveforms 38 and 40. Waveform 38 is attenuated with respect to waveform 40, as determined by the R1/R3 voltage divider, and leads waveform 40 by an amount equal to the delay imparted by shift register 32. The LP1 and LP2 filter outputs are connected respectively to the negative and positive inputs of the output comparator CMP1. This device produces an output logic signal indicated by waveform 42. The output signal is initially LO (42a), then shifts to HI (42b) when the delayed waveform 40 has risen above the undelayed but attenuated waveform 38, and finally drops back to LO (42c) when both signals have passed.

The pulse's delayed time of arrival occurs at the rising edge of the output pulse 42; the true time of arrival is simply the rising edge of the output pulse minus the delay imparted by shift register 32.

To detect the time at which the input pulse terminates, a similar comparison can be performed between the delayed and undelayed signals. In this case, however, a scaling offset is established between the two signals such that the undelayed signal is scaled larger than the delayed signal. This second scaling is preferably accomplished by attenuating the delayed signal at the output of buffer B2 by 6 dB and comparing it with the undelayed $-3$ dB signal However, if desired it could also be implemented by amplifying the undelayed signal by $+3$dB. The width of the input pulse signal can then be obtained by subtracting the pulse time of arrival from its time of termination.

Circuitry for determining the pulse's time of termination includes a third lowpass filter LP3 that is combined with a $-6$ dB attenuator and is connected between the output of buffer B2 and the positive input to a third comparator CMP3. The design of filter LP3 is similar to that of LP1, with a parallel resistor R4 and capacitor C5 combination connected between the positive input to CMP3 and ground, and an attenuating resistor R5 connected between R4 and the output of buffer B2. The positive input of comparator CMP3 thus receives a delayed signal that is similar to that received by the positive input of comparator CMP1, but attenuated by $-6$ dB. The negative input to CMP3 is connected directly to the negative input of CMP1, and thus receives the same undelayed $-3$dB signal.

The output waveform from CMP3 is illustrated by waveform 44. The output signal is initially LO (44a), then shifts to HI (44b) when the undelayed $-3$dB signal at CMP3's negative input falls below the delayed $-6$ dB signal at its positive input, and finally drops back to LO (44c) when both signals have passed. To determine the pulse width a signal processor 46, such as a conventional microprocessor, notes the pulse's time of arrival from waveform 42, its time of termination from waveform 44, and simply subtracts the time of arrival from the time of termination to obtain the pulse width. This information is then provided on an output terminal 48.

Figure 5:
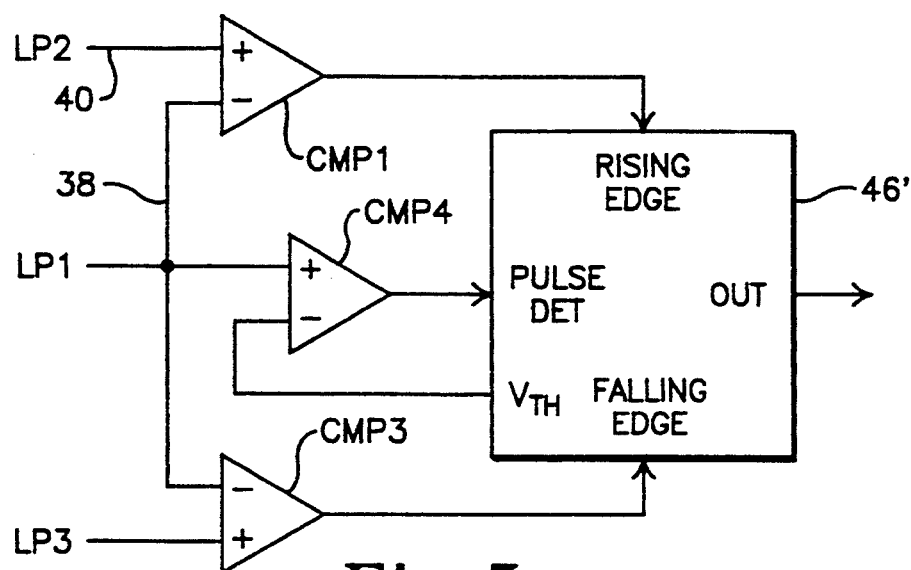
FIG. 5 is a circuit diagram showing an alternate circuit for determining time of arrival and time of termination from the delayed and undelayed waveforms provided by the circuit of FIG. 4.

Although the capacitor charge/discharge oscillations and most noise is removed by filters LP1–LP3, some residual noise will still normally be present in the signals applied to the output comparators CMP1 and CMP3. The effects of the residual noise can be eliminated with a circuit such as that shown in FIG. 5. In this circuit a signal processor 46' provides a threshold voltage $V_{T4}$ that is selected to be slightly higher than the anticipated residual noise level. $V_{T4}$ is applied to the negative input of an additional comparator CMP4, and the delayed input signal 38 to its positive input. the presence of a delayed pulse, as opposed to noise, is indicated when the delayed input signal 38 exceeds $V_{T4}$. When this occurs the comparator CMP4 delivers a signal to signal processor 46' that enables it to produce appropriate outputs when a pulse's rising and falling edges are detected by comparators CMP1 and CMP3; the signal processor is prevented from producing these outputs in the absence of a signal from CMP4. The production of false pulse arrival or termination signals from noise associated with the inputs to CMP1 and CMP3 is thus inhibited.

Figure 6:
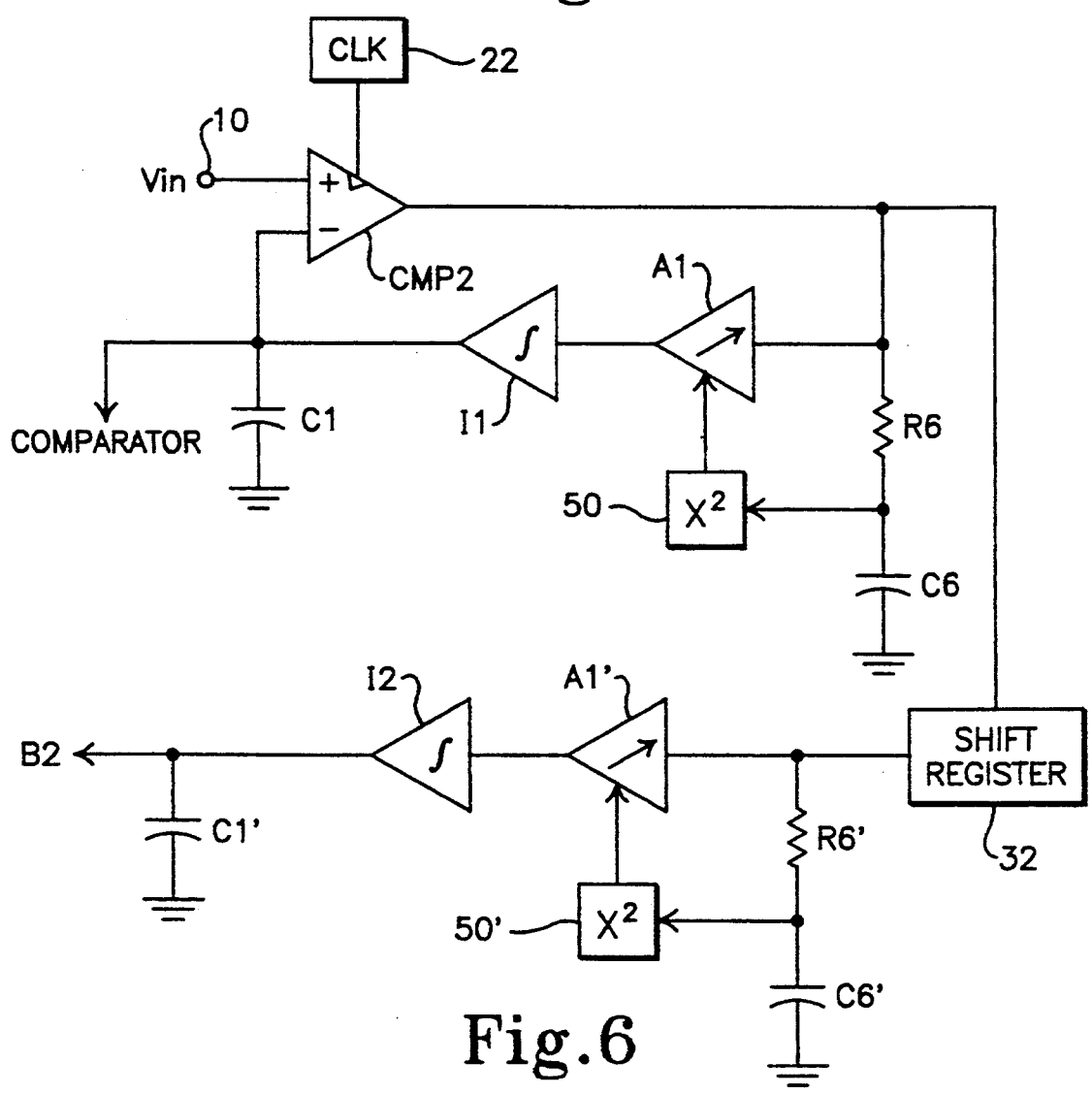
FIG. 6 is a circuit diagram of an adaptive delta modulation circuit that can be used in the invention.

The delta modulator 20 can overload if the slew rate of the input signal at input terminal 10 is too high. If this occurs the input latching comparator CMP2 cannot produce HI pulses fast enough to keep up with the increase in the input signal, and the output of integrator I1 will lag behind the input signal. For this situation it is desirable to use an adaptive delta modulator, which is also a known circuit. A suitable implementation for an adaptive delta modulator is illustrated in FIG. 6, in which elements that are the same as in FIG. 4 are identified by the same reference numerals; the circuit is simplified by showing it as a one-line diagram. A series RC circuit that consists of resistor R6 and capacitor C6 is connected between the output of latching comparator CMP2 and ground. The resistor-capacitor combination serves as an integrator, with the voltage across C6 proportional to the integral of the pulse signal at the output of CMP2. This voltage is applied via a square law element 50 to the gain control terminal of a gain controlled amplifier A1; the square law element 50 ensures that a positive voltage is applied to the gain control terminal. The gain controlled amplifier A1 is inserted in the circuit between the output of latching comparator CMP2 and integrator I1. It functions by increasing the drive applied to integrator I1 for high input slew rates, and decreasing the integrator drive when the input slew rate is low. A similar circuit, consisting of a gain controlled amplifier A1' an RC circuit R6' and C6' and a square low element 50' is added between shift register 32 and integrator I2.

In operation, a high slew rate input signal produces a constant polarity signal at the output of CMP2. Since the gain controlled amplifier A1 is set at maximum gain when the voltage across capacitor C6 is zero, a large signal at the input to A1 will result in a large output applied from A1 to the input of integrator I1. If the output of comparator CMP2 remains high, C6 charges up and the square low circuit 50 reduces the gain of A1. The time constant of the R6/C6 circuit is selected to correspond to the maximum expected input slew rate. That is, C6 is almost fully charged when C1 is close to the input voltage Vin. The A1'/50'/R6'/C6' circuit between the shift register 32 and the integrator I2 is matched with the adaptive circuit A1/50/R6/C6 and operates in a similar manner.

Although delta modulators are well known, the integrated output from integrator I1 is typically used only as a reference for the input signal in the latching comparator CMP2. In addition to this conventional application as a digitizing reference, the invention makes a unique use of the integrated signal from I1 by employing it as the undelayed analog signal used in the time of arrival determination.

In a particular implementation of the invention designed for a 1 GHz clock frequency, the following component values were used. These values should not be taken as limiting, since numerous alternate circuit designs could be envisioned.

|           |            |
| --------- | ---------- |
| R1 = 1K   | C1 = 1 pF  |
| R2 = 1K   | C2 = 1 pF  |
| R3 = 2.4K | C3 = 7 pF  |
| R4 = 1K   | C4 = 5 pF  |
| R5 = 1K   | C5 = 10 pF |
| R6 = 1K   | C6 = 5 pF  |

While a particular embodiment of the invention has been shown and described, numerous variations and alternate embodiments will occur to those skilled in the art. Accordingly, it is intended that the invention be limited only in terms of the appended claims.

We claim:

1. A time of arrival detector for an analog input signal, comprising:
   analog-to-digital converter (ADC) means for converting said input analog signal to a digitized format,
   digital delay means for delaying said digitized input signal by a predetermined time delay,
   digital-to-analog converter means for converting said delayed digitized input signal to an analog format,
   means for providing an undelayed analog version of said input signal,
   means for establishing a first scaling offset between said delayed and undelayed signals so that said delayed analog signal is scaled larger than said undelayed signal, and
   first means for comparing said delayed and undelayed signals after said first scaling offset to establish a time of arrival for said analog input signal.

2. The time of arrival detector of claim 1, wherein said ADC means includes said means for providing said undelayed analog version of the input signal by converting said digitized signal prior to said delay back to an analog format for said comparison with said delayed input signal.

3. The time of arrival detector of claim 1, said first scaling offset means comprising means for attenuating said undelayed signal.

4. The time of arrival detector of claim 1, wherein said first comparing means includes means for establishing a time of arrival indication only in response to said delayed signal exceeding said undelayed signal by at least a predetermined threshold amount.

5. The time of arrival detector of claim 1, said analog input signal comprising a pulse with a rising edge and a falling edge, further comprising means for establishing a second scaling offset between the signals compared by said comparing means so that said undelayed signal is scaled larger than said delayed signal after said second scaling offset, and second means for comparing said undelayed and delayed signals after said second scaling offset to establish a time of termination for said analog input signal.

6. The time of arrival detector of claim 5, said first scaling offset means comprising means for attenuating said undelayed signal presented to the first comparator relative to said delayed input signal, and said second scaling offset means comprising means for attenuating said delayed signal relative to said attenuated undelayed signal.

7. The time of arrival detector of claim 5, further comprising means responsive to the outputs of said first and second comparing means for sensing the width of said input pulse signal between said arrival and termination times.

8. A time of arrival detector for an analog input signal, comprising:
   a delta modulator circuit which includes:
      an input latching comparator having a first input connected to receive said analog input signal, a second input, and an output,
      a clock input for clocking said input latching circuit at a sampling rate for said input analog signal, and
      an integrator circuit having an input connected to the output of said input latching comparator and an output connected to the second input of said input latching comparator, whereby the output of said input latching comparator carries a digitized version of said input analog signal, and the output of said integrator circuit carries a reconverted analog version of said digitized signal, a digital delay means connected to the output of said latching comparator to delay said digitized input signal by a predetermined time delay, a digital-to-analog converter (DAC) connected to convert said delayed digitized input signal to an analog format, means for establishing a first scaling offset between the outputs of said DAC and said integrator circuit so that said delayed analog input signal is scaled larger than the undelayed reconverted analog signal at the output of said integrator circuit, and a first output means for comparing said scaled DAC and integrator circuit outputs and producing a time of arrival indication in response to said DAC output exceeding said integrator circuit output.

9. The time of arrival detector of claim 8, said means for establishing said first scaling offset comprising an attenuator circuit that is connected in the path of said reconverted analog input signal between the output of said integrator circuit and the input of said first output comparator.

10. The time of arrival detector of claim 8, wherein said first output means includes means for producing a time of arrival indication only in response to said DAC output exceeding said integrator circuit output by at least a predetermined threshold amount.

11. The time of arrival detector of claim 8, said analog input signal comprising a pulse with a rising edge and a falling edge, further comprising means for detecting the arrival of said falling edge, comprising:

means for establishing a second scaling offset between the signals compared by said first output comparing means so that said undelayed reconverted analog signal is scaled larger than said delayed analog input signal, and second output means for comparing said second offset scaled signals to produce a time of arrival indication for said falling input signal edge in response to said undelayed reconverted analog signal exceeding said delayed analog input signal after said second scaling offset.

12. The time of arrival detector of claim 11, said first scaling offset means comprising means for attenuating said undelayed reconverted analog signal presented to the first output comparing means relative to said delayed analog input signal, and said second scaling offset means comprising means for attenuating said delayed analog input signal relative to said attenuated undelayed reconverted analog signal.

13. The time of arrival detector of claim 11, further comprising means responsive to the outputs of said first and second output comparing means for sensing the width of said input pulse signal between the times of arrival of its leading and trailing edges.

14. The time of arrival detector of claim 8, said latching comparator having a pair of complementary outputs, and said integrator circuit comprising (a) an integrating comparator connected to compare said complementary latching comparator outputs and to produce a charging output when a predetermined one of said latching comparator outputs is HIGH and the other latching comparator output is LOW, and (b) a capacitor connected to be charged by the charging output of said integrating comparator, said capacitor providing the integrator circuit output.

15. The time of arrival circuit of claim 14, said means for establishing said first scaling offset comprising an RC attenuator circuit connected between said capacitor and the input of said first output comparing means, said RC attenuator circuit also establishing a low pass filter for smoothing the capacitor signal prior to its application to the first output comparing means.

16. The time of arrival circuit of claim 15, further comprising a buffer circuit connected to prevent said capacitor from discharging through said low pass filter.

17. The time of arrival circuit of claim 8, said latching comparator having a pair of complementary digitized outputs, each of which is delayed by said digital delay means, and said DAC comprising an integrator circuit which comprises (a) an integrating comparator connected to compare said digitized delayed complementary latching comparator outputs and to produce a charging output when a predetermined one of said digitized delayed latching comparator outputs is HIGH and the other is LOW, and (b) a capacitor connected to be charged by the charging output of said integrating comparator, said capacitor providing the DAC output.

18. The time of arrival detector of claim 17, further comprising a low pass filter connected between the DAC output and the input to the first output comparing means to smooth the DAC output prior to its application to the first output comparing means.

19. The time of arrival detector of claim 18, further comprising a buffer circuit connected to prevent said capacitor from discharging through said low pass filter.

* * * * *